(12) United States Patent
Kwon

(10) Patent No.: US 10,825,788 B2
(45) Date of Patent: Nov. 3, 2020

(54) METHOD FOR MANUFACTURING COMPLIANT BUMP

(71) Applicant: LBSEMICON CO., LTD., Gyeonggi-do (KR)

(72) Inventor: Jae Jin Kwon, Gyeonggi-do (KR)

(73) Assignee: LBSEMICON CO., LTD., Gyeonggi-do (KR)

( * ) Notice: Subject to any disclaimer, the term of this patent is extended or adjusted under 35 U.S.C. 154(b) by 161 days.

(21) Appl. No.: 16/310,980

(22) PCT Filed: Dec. 28, 2017

(86) PCT No.: PCT/KR2017/015669
§ 371 (c)(1),
(2) Date: Dec. 18, 2018

(87) PCT Pub. No.: WO2018/164360
PCT Pub. Date: Sep. 13, 2018

(65) Prior Publication Data
US 2020/0266164 A1    Aug. 20, 2020

(30) Foreign Application Priority Data

Mar. 6, 2017 (KR) .................. 10-2017-0028344

(51) Int. Cl.
*H01L 21/44* (2006.01)
*H01L 23/00* (2006.01)

(52) U.S. Cl.
CPC .............. *H01L 24/11* (2013.01); *H01L 24/13* (2013.01); *H01L 2224/10125* (2013.01);
(Continued)

(58) Field of Classification Search
CPC .................. H01L 24/11; H01L 24/13; H01L 2224/11618; H01L 2224/11013;
(Continued)

(56) References Cited

U.S. PATENT DOCUMENTS 7,122,896 B2 * 10/2006 Saito ................ H01L 23/49816
257/738
7,763,536 B2 * 7/2010 Yamasaki ............... H01L 24/11
438/614
(Continued)

FOREIGN PATENT DOCUMENTS

JP     2003347410 A   12/2003
JP     2007042777 A    2/2007
(Continued)

*Primary Examiner* — Ismail A Muse
(74) *Attorney, Agent, or Firm* — Stuart H. Mayer; Mayer & Williams PC

(57) ABSTRACT

Provided is a method of manufacturing compliant bumps, the method including preparing an electronic device including at least one conductive pad, forming an elastic resin layer on the electronic device, forming a photoresist layer on the elastic resin layer, forming a first photoresist pattern on a region spaced apart from a region where the conductive pad is located, forming a second photoresist pattern having a lower cross-sectional area greater than an upper cross-sectional area, forming an elastic resin pattern having a lower cross-sectional area greater than an upper cross-sectional area, on a region spaced apart from a region where the conductive pad is located, and forming a conductive wiring pattern covering at least a part of the elastic resin pattern and extending to the conductive pad.

14 Claims, 12 Drawing Sheets

(52) U.S. Cl.
CPC ............... *H01L 2224/11013* (2013.01); *H01L 2224/1146* (2013.01); *H01L 2224/11614* (2013.01); *H01L 2224/11618* (2013.01); *H01L 2224/13083* (2013.01)

(58) Field of Classification Search
CPC ... H01L 2224/13083; H01L 2224/1146; H01L 2224/11614; H01L 2224/10125
See application file for complete search history.

(56) References Cited

U.S. PATENT DOCUMENTS

| | | | | |
|---|---|---|---|---|
| 2003/0207494 | A1* | 11/2003 | Suzuki | H01L 23/3114 438/107 |
| 2003/0218247 | A1* | 11/2003 | Shimoishizaka | H01L 23/3114 257/734 |
| 2005/0037539 | A1* | 2/2005 | Suzuki | H01L 24/13 438/107 |
| 2005/0062153 | A1* | 3/2005 | Saito | H05K 3/325 257/737 |
| 2005/0199979 | A1* | 9/2005 | Shimoishizaka | H01L 23/3114 257/528 |
| 2006/0091539 | A1* | 5/2006 | Tanaka | H01L 24/83 257/737 |
| 2006/0286790 | A1* | 12/2006 | Yamasaki | H01L 24/11 438/612 |
| 2006/0288572 | A1* | 12/2006 | Tanaka | H01L 24/11 29/846 |
| 2007/0001200 | A1* | 1/2007 | Imai | H01L 24/13 257/288 |
| 2007/0029652 | A1* | 2/2007 | Asakawa | H01L 24/10 257/667 |
| 2007/0029671 | A1* | 2/2007 | Yamasaki | H01L 24/13 257/737 |
| 2007/0057371 | A1* | 3/2007 | Hashimoto | H01L 24/13 257/738 |
| 2008/0099914 | A1* | 5/2008 | Saito | H01L 24/11 257/737 |
| 2008/0197486 | A1* | 8/2008 | Asakawa | H01L 24/02 257/734 |
| 2008/0197505 | A1* | 8/2008 | Asakawa | H01L 24/05 257/773 |
| 2009/0115054 | A1* | 5/2009 | Hashimoto | H01L 24/13 257/737 |
| 2010/0201001 | A1* | 8/2010 | Asakawa | H01L 24/14 257/776 |
| 2010/0244202 | A1* | 9/2010 | Onodera | H01L 21/76898 257/621 |
| 2011/0115076 | A1* | 5/2011 | Yamasaki | H01L 24/13 257/737 |
| 2011/0136337 | A1* | 6/2011 | Yamasaki | H01L 24/05 438/618 |
| 2011/0204522 | A1* | 8/2011 | Lee | H01L 24/03 257/770 |

FOREIGN PATENT DOCUMENTS

| | | |
|---|---|---|
| KR | 1007545750000 | 9/2007 |
| KR | 1020080037550 | 4/2008 |
| KR | 1020100068698 | 6/2010 |
| KR | 1010699560000 | 11/2011 |

* cited by examiner

METHOD FOR MANUFACTURING COMPLIANT BUMP

TECHNICAL FIELD

The present invention relates to a method of manufacturing bumps and, more particularly, to a method of manufacturing compliant bumps.

BACKGROUND ART

As electronic apparatuses are improved in various functions and are reduced in sizes, development of bumps for bonding an electronic device and a method of manufacturing the same is in progress. In a bonding process using a plurality of bumps on a chip, warpage of the chip and residual strain occur due to non-uniform or different bump heights.

Related technology includes Korean Application Publication 2010-0068698 published on Jun. 24, 2010 and entitled "BUMP BONDING STRUCTURE COMPRISING PATTERN BUMP FOR COPLANIRITY AND ITS PATTERN BUMP FORMING METHOD".

DETAILED DESCRIPTION OF THE INVENTION

Technical Problem

The present invention provides a method of manufacturing bumps, the method being capable of relieving residual strain occurring due to non-uniform or different bump heights in a bonding process using a plurality of bumps on a chip. However, the scope of the present invention is not limited thereto.

Technical Solution

According to an aspect of the present invention, there is provided a method of manufacturing compliant bumps, the method including preparing an electronic device including at least one conductive pad, forming an elastic resin layer on the electronic device, forming a photoresist layer on the elastic resin layer, forming a first photoresist pattern on a region spaced apart from a region where the conductive pad is located, by performing a photolithography process on the photoresist layer, forming a second photoresist pattern having a lower cross-sectional area greater than an upper cross-sectional area, by performing a bake process on the first photoresist pattern, forming an elastic resin pattern having a lower cross-sectional area greater than an upper cross-sectional area, on a region spaced apart from a region where the conductive pad is located, by performing an etching process on the elastic resin layer by using the second photoresist pattern as a mask, and forming a conductive wiring pattern covering at least a part of the elastic resin pattern and extending to the conductive pad.

The forming of the conductive wiring pattern may include sequentially forming a barrier metal layer and a seed layer on the electronic device having the elastic resin pattern formed thereon and including the conductive pad, forming a blocking pattern selectively on a first region of the seed layer and forming a plated layer on the seed layer, and forming a seed pattern and a barrier metal pattern by removing the blocking pattern and then etching exposed parts of the seed layer and the barrier metal layer.

The forming of the conductive wiring pattern may include sequentially forming a barrier metal layer and a seed layer on the electronic device having the elastic resin pattern formed thereon and including the conductive pad, forming a blocking pattern selectively on a second region of the seed layer, and forming a barrier metal pattern and a seed pattern on the electronic device by etching parts of the seed layer and the barrier metal layer, and forming a plating pattern on the seed pattern.

The at least one conductive pad may include a plurality of conductive pads spaced apart from each other, the conductive wiring pattern may include a plurality of conductive wiring patterns spaced apart from each other, and the elastic resin pattern may have a height of a region thereof where the conductive wiring patterns are located, which is equal to a height of an interval region thereof between the plurality of conductive wiring patterns, and may integrally extend to correspond to the plurality of conductive pads.

The at least one conductive pad may include a plurality of conductive pads spaced apart from each other, the conductive wiring pattern may include a plurality of conductive wiring patterns spaced apart from each other, and parts of the elastic resin pattern exposed between the plurality of conductive wiring patterns may be etched by a partial thickness after the conductive wiring patterns are formed, such that the elastic resin pattern may have a height of a region thereof where the conductive wiring patterns are located, which is greater than a height of an interval region thereof between the plurality of conductive wiring patterns, and may integrally extend to correspond to the plurality of conductive pads.

The at least one conductive pad may include a plurality of conductive pads spaced apart from each other, the conductive wiring pattern may include a plurality of conductive wiring patterns spaced apart from each other, and parts of the elastic resin pattern exposed between the plurality of conductive wiring patterns may be completely etched after the conductive wiring patterns are formed, such that the elastic resin pattern may include a plurality of elastic resin patterns formed only under the conductive wiring patterns and spaced apart from each other to correspond to the plurality of conductive pads.

The at least one conductive pad may include a plurality of conductive pads spaced apart from each other, the conductive wiring pattern may include a plurality of conductive wiring patterns spaced apart from each other, and the first photoresist pattern may include a pattern integrally extending to correspond to the plurality of conductive pads.

The at least one conductive pad may include a plurality of conductive pads spaced apart from each other, the conductive wiring pattern may include a plurality of conductive wiring patterns spaced apart from each other, and the first photoresist pattern may include a plurality of patterns spaced apart from each other to correspond to the plurality of conductive pads.

Advantageous Effects

As described above, according to an embodiment of the present invention, a method of manufacturing bumps, the method being capable of relieving residual strain occurring due to non-uniform or different bump heights in a bonding process using a plurality of bumps on a chip. However, the scope of the present invention is not limited to the above-described effect.

MODE OF THE INVENTION

Figure 1A:
FIGS. 1A to 1H are cross-sectional views for describing first-half operations of a method of manufacturing compliant bumps, according to an embodiment of the present invention.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated or reduced for convenience of explanation.

FIGS. 1A to 1H are cross-sectional views for describing first-half operations of a method of manufacturing compliant bumps, according to an embodiment of the present invention.

Referring to FIG. 1A, an electronic device 100 including at least one conductive pad 104 is prepared. The electronic device 100 includes a semiconductor chip or integrated chip (IC) 102 including at least one of a transistor, a wiring pattern, and an insulating pattern formed on a substrate. The substrate may include, for example, a wafer containing silicon (Si) or a substrate containing polymer and ceramic including glass. The conductive pad 104 may be formed by generating and patterning a metal layer on the semiconductor chip or IC chip 102. As a non-limiting example, the metal layer may include an aluminum (Al) layer or a tungsten (W) layer. The conductive pad 104 may be electrically connected to a rewiring pattern formed to efficiently establish an electrical connection. The electronic device 100 may further include a passivation pattern 106 for preventing physical or chemical damages of the rewiring pattern and the conductive pad 104 due to an external factor.

Figure 1B:
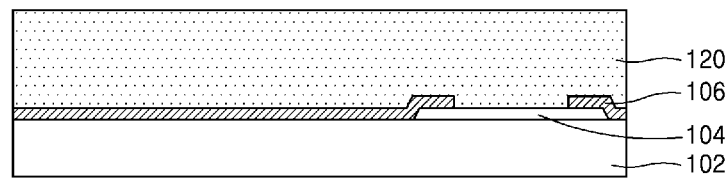

Referring to FIG. 1B, an elastic resin layer 120 is formed on the electronic device 100 including the at least one conductive pad 104. After the elastic resin layer 120 is formed, a curing process may be further performed. As a non-limiting example, a material of the elastic resin layer 120 may include polyimide, acryl, phenol, silicone, silicone-modified polyimide, or epoxy.

Figure 1C:
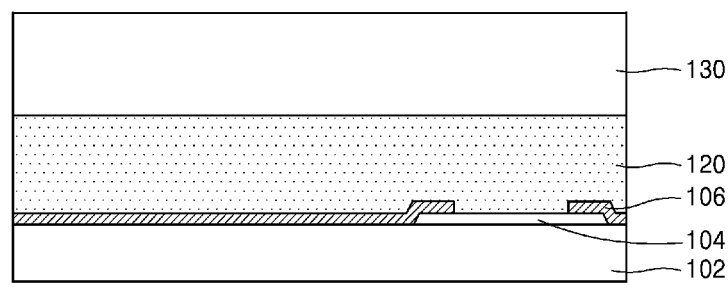

Referring to FIG. 1C, a photoresist layer 130 is formed on the elastic resin layer 120. The photoresist layer 130 is a selectively patternable material layer due to its variable material structure based on exposure to light of a specific wavelength range. The photoresist layer 130 and the elastic resin layer 120 may be made of different materials and the photoresist layer 130 may be more sensitive to light than the elastic resin layer 120 while the elastic resin layer 120 is more elastic than the photoresist layer 130.

Figure 1D:
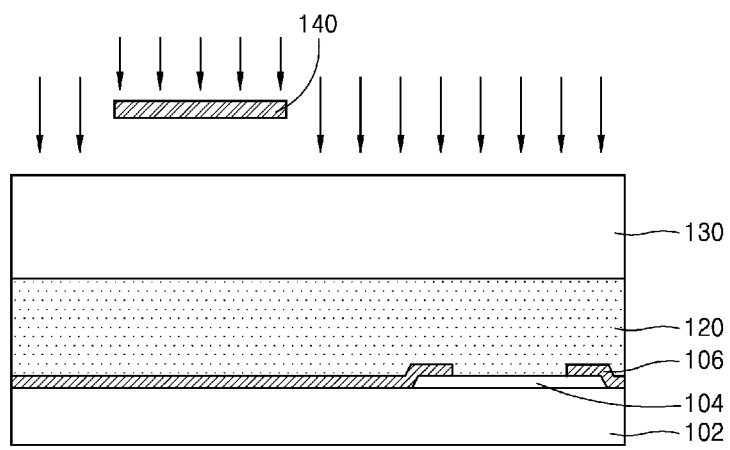
Figure 1E:
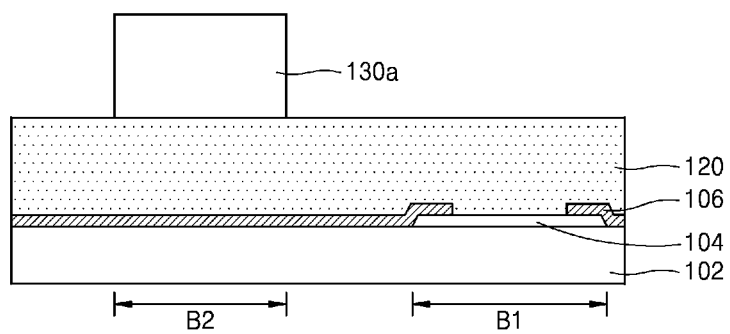

Referring to FIGS. 1D and 1E, a first photoresist pattern 130a is formed on a region B2 spaced apart from a region B1 where the conductive pad 104 is located, by performing a photolithography process on the photoresist layer 130. The photolithography process may include a process of exposing the photoresist layer 130 to light by using a mask 140. The first photoresist pattern 130a may be a pattern having substantially equal upper and lower cross-sectional areas.

Figure 1F:
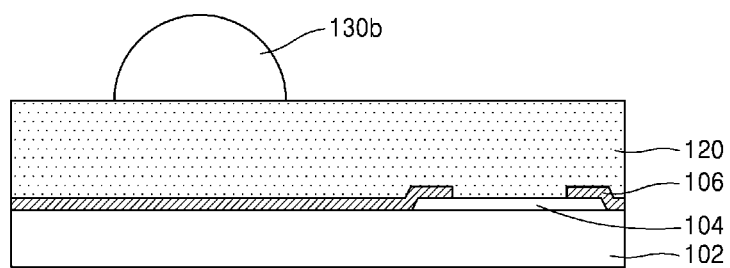

Referring to FIG. 1F, a second photoresist pattern 130b having a lower cross-sectional area greater than an upper cross-sectional area is formed by performing a bake process on the first photoresist pattern 130a. For example, the second photoresist pattern 130b may be a hemispherical pattern or a part of an oval pattern. Contraction of the first photoresist pattern 130a bonded to the elastic resin layer 120 increases in a direction away from the elastic resin layer 120 in the bake process. That is, a contractive force is cancelled at a lower part of the first photoresist pattern 130a by a bonding force with the elastic resin layer 120, and the cancellation of the contractive force by the bonding force with the elastic resin layer 120 is gradually weakened toward an upper part of the first photoresist pattern 130a. A top part of the first photoresist pattern 130a has the minimum horizontal cross-sectional area.

Figure 1G:
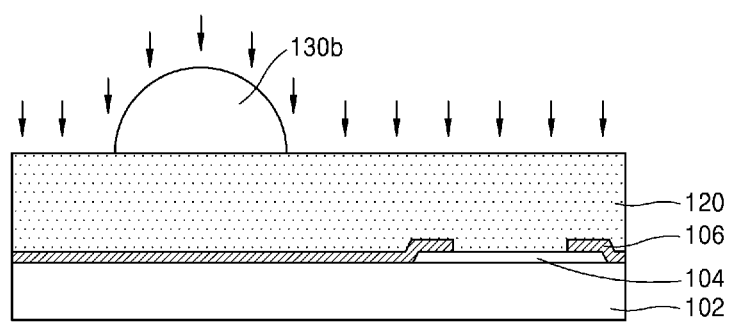
Figure 1H:
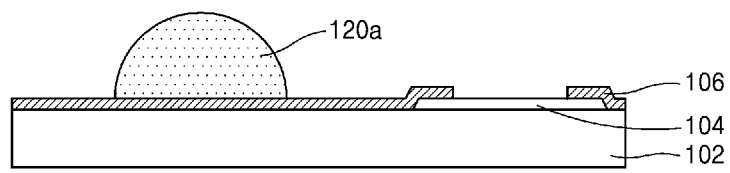

Referring to FIGS. 1G and 1H, an elastic resin pattern 120a having a lower cross-sectional area greater than an upper cross-sectional area is formed on a region spaced apart from a region where the conductive pad 104 is located, by performing an etching process on the elastic resin layer 120 by using the second photoresist pattern 130b as a mask. That is, the shape of the second photoresist pattern 130b is transferred to the elastic resin layer 120 to form the elastic resin pattern 120a. For example, the elastic resin pattern 120a may be a hemispherical pattern and a part of an oval pattern.

Figure 2A:
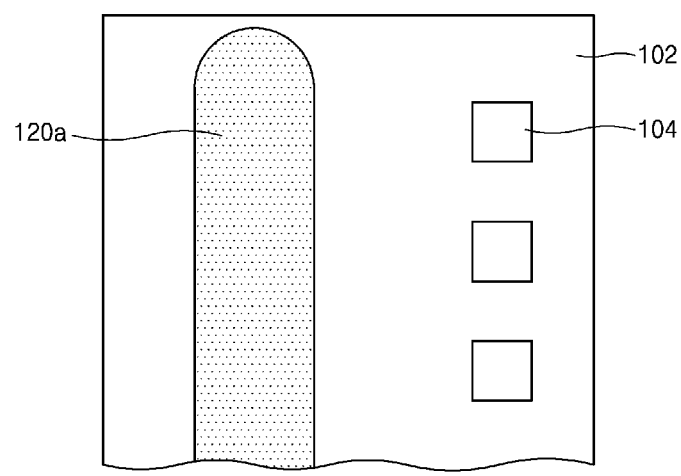
FIGS. 2A and 2B are plan views showing various examples of an elastic resin pattern formed using a method of manufacturing compliant bumps, according to an embodiment of the present invention.
Figure 2B:
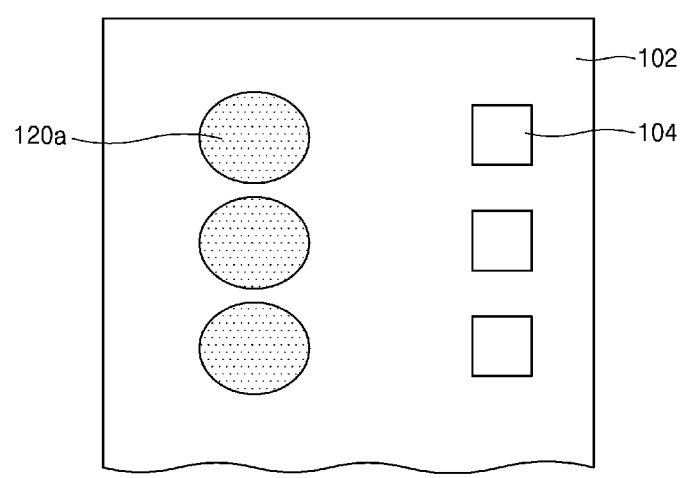

FIGS. 2A and 2B are plan views showing various examples of the elastic resin pattern 120a formed using a method of manufacturing compliant bumps, according to an embodiment of the present invention.

Referring to FIG. 2A, when the conductive pad 104 includes a plurality of patterns spaced apart from each other, the elastic resin pattern 120a may not be divided but may be integrally formed to extend to correspond to the plurality of conductive pads 104. A direction in which the elastic resin pattern 120a extends may be parallel to a direction in which the plurality of conductive pads 104 are aligned. In this case, since the elastic resin pattern 120a is transferred from the second photoresist pattern 130b and formation of the second photoresist pattern 130b basically depends on the first photoresist pattern 130a, the mask 140 illustrated in FIG. 1D may be configured in such a manner that the first photoresist pattern 130a is not be divided but is integrally formed to extend to correspond to the plurality of conductive pads 104.

Referring to FIG. 2B, when the conductive pad 104 includes a plurality of patterns spaced apart from each other, the elastic resin pattern 120a may also include a plurality of patterns spaced apart from each other to correspond to the conductive pads 104. A direction in which the elastic resin patterns 120a are aligned may be parallel to a direction in which the plurality of conductive pads 104 are aligned. In this case, since the elastic resin patterns 120a are transferred from the second photoresist pattern 130b and formation of the second photoresist pattern 130b basically depends on the first photoresist pattern 130a, the mask 140 illustrated in FIG. 1D may be configured in such a manner that the first photoresist pattern 130a is divided into a plurality of patterns spaced apart from each other to correspond to the plurality of conductive pads 104.

FIGS. 3A to 3G are cross-sectional views for describing second-half operations of a method of manufacturing compliant bumps, according to an embodiment of the present invention. The second-half operations include an operation of forming a conductive wiring pattern 150a covering at least a part of the elastic resin pattern 120a and extending to the conductive pad 104.

Figure 3A:
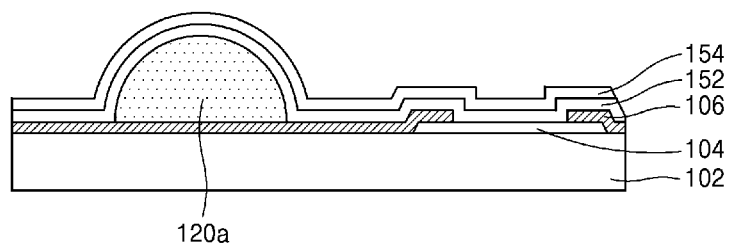
FIGS. 3A to 3G are cross-sectional views for describing second-half operations of a method of manufacturing compliant bumps, according to an embodiment of the present invention.

Referring to FIG. 3A, a barrier metal layer 152 and a seed layer 154 are sequentially formed on the electronic device 100 having the elastic resin pattern 120a formed thereon and including the conductive pad 104. The barrier metal layer 152 and the seed layer 154 may not only cover both of the elastic resin pattern 120a and the conductive pad 104 but also cover the passivation pattern 106 for preventing physical or chemical damages of the rewiring pattern and the conductive pad 104 due to an external factor.

Figure 3B:
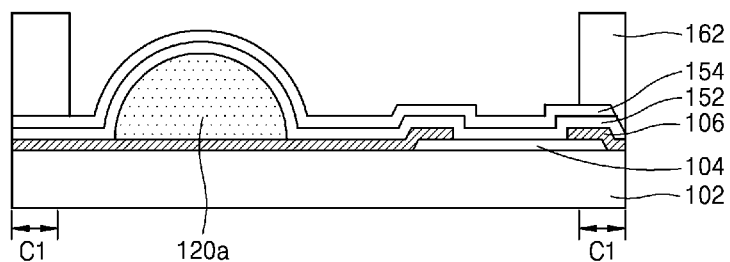
Figure 3C:
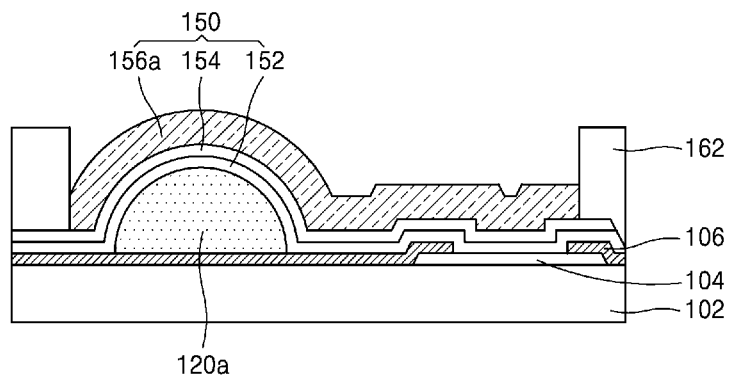

Referring to FIGS. 3B and 3C, a blocking pattern 162 is formed selectively on a first region C1 of the seed layer 154, and a plated layer 156a is formed on the seed layer 154. The barrier metal layer 152, the seed layer 154, and the plated layer 156a configure a conductive wiring layer 150.

Figure 3D:
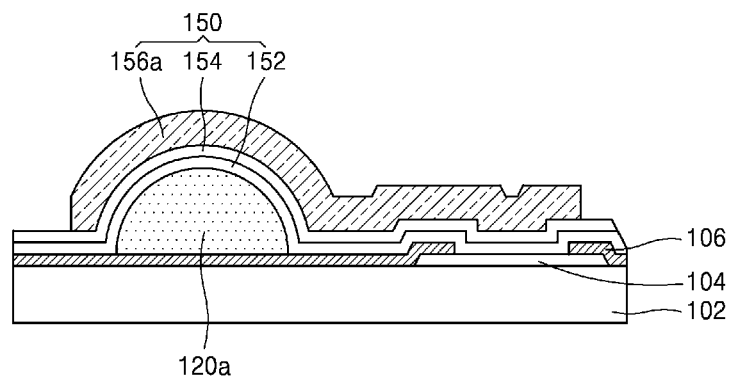
Figure 3E:
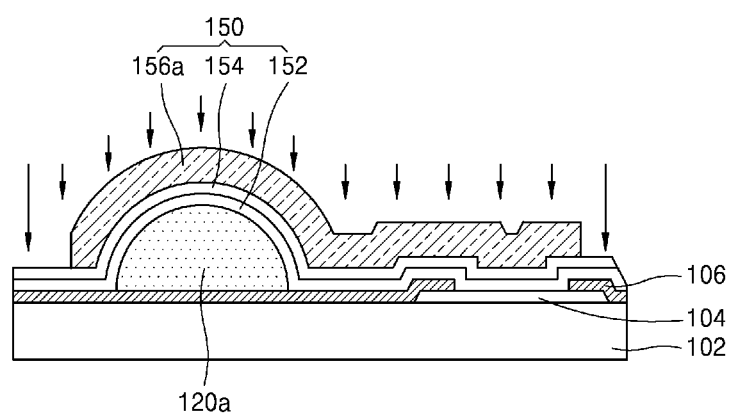
Figure 3F:
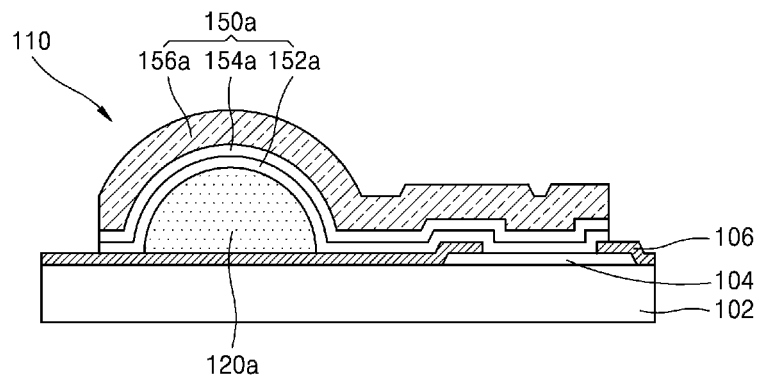

Referring to FIGS. 3D to 3F, a seed pattern 154a and a barrier metal pattern 152a are formed by removing the blocking pattern 162 and then etching exposed parts of the seed layer 154 and the barrier metal layer 152. In this etching process, the plated layer 156a may serve as a sort of a hard mask.

The barrier metal pattern 152a, the seed pattern 154a, and the plated layer 156a configure the conductive wiring pattern 150a. The conductive wiring pattern 150a covers at least a part of the elastic resin pattern 120a and extends to the conductive pad 104. The conductive wiring pattern 150a and the elastic resin pattern 120a configure a compliant bump 110. The elastic resin pattern 120a may serve as a core of the compliant bump 110 and may relieve strain due to a height difference between neighboring bumps in a bump bonding process.

Figure 3G:
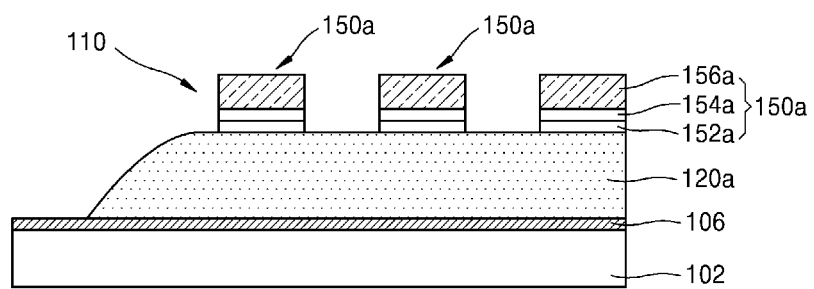
Figure 4:
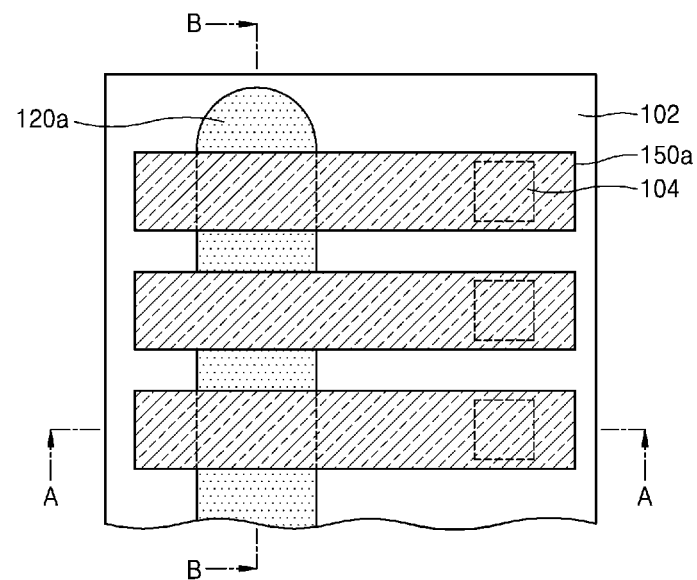
FIG. 4 is a partial plan view of a structure formed using a method of manufacturing compliant bumps, according to an embodiment of the present invention.

FIG. 3F is a cross-sectional view cut along line A-A of FIG. 4 which is a partial plan view of a structure formed using a method of manufacturing compliant bumps, according to an embodiment of the present invention. FIG. 3G is a cross-sectional view cut along line B-B of FIG. 4.

FIGS. 5A to 5E are cross-sectional views for describing modified second-half operations of a method of manufacturing compliant bumps, according to an embodiment of the present invention. The modified second-half operations include an operation of forming the conductive wiring pattern 150a covering at least a part of the elastic resin pattern 120a and extending to the conductive pad 104.

Figure 5A:
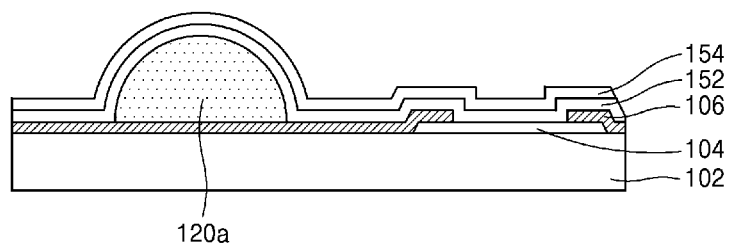
FIGS. 5A to 5E are cross-sectional views for describing modified second-half operations of a method of manufacturing compliant bumps, according to an embodiment of the present invention.

Referring to FIG. 5A, the barrier metal layer 152 and the seed layer 154 are sequentially formed on the electronic device 100 having the elastic resin pattern 120a formed thereon and including the conductive pad 104. The barrier metal layer 152 and the seed layer 154 may not only cover both of the elastic resin pattern 120a and the conductive pad 104 but also cover the passivation pattern 106 for preventing physical or chemical damages of the rewiring pattern and the conductive pad 104 due to an external factor.

Figure 5B:
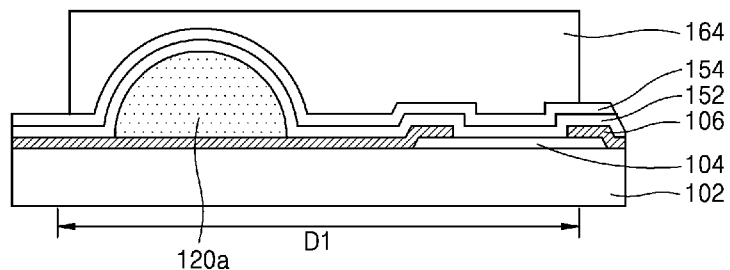
Figure 5C:
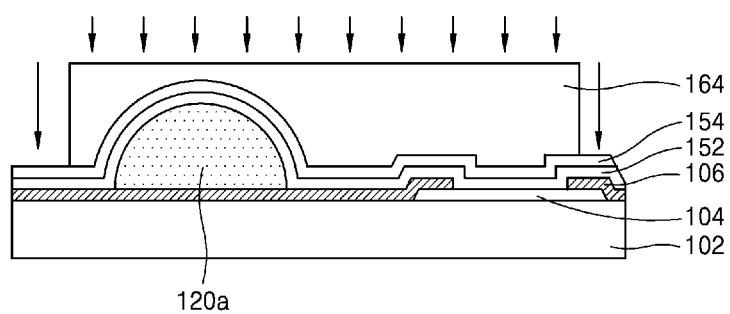
Figure 5D:
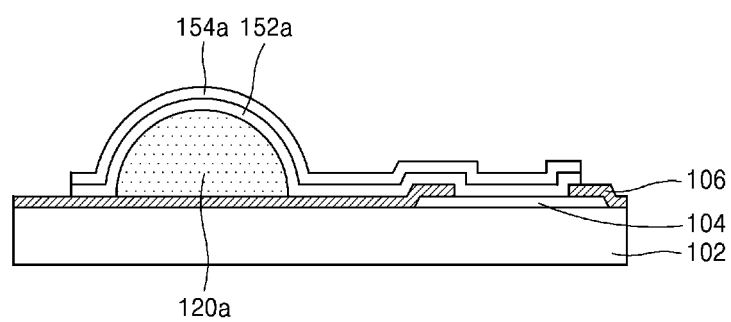

Referring to FIG. 5B to FIG. 5D, a blocking pattern 164 is formed selectively on a second region D1 of the seed layer 154, and the seed pattern 154a and the barrier metal pattern 152a are formed on the electronic device 100 by etching parts of the seed layer 154 and the barrier metal layer 152. In this etching process, no plated layer is present.

Figure 5E:
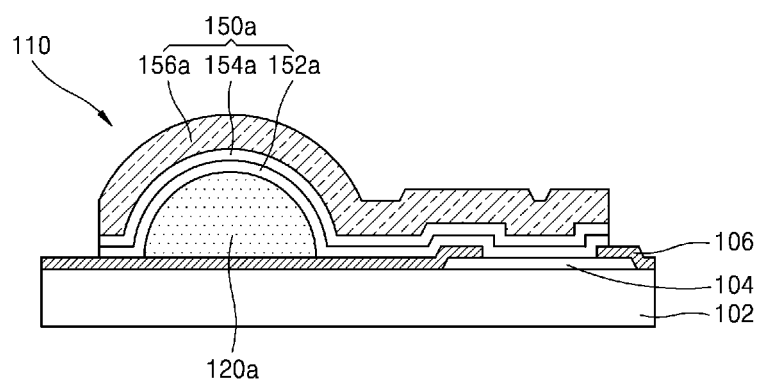

Referring to FIG. 5E, the plated layer 156a is formed on the seed pattern 154a. The barrier metal pattern 152a, the seed pattern 154a, and the plated layer 156a configure the conductive wiring pattern 150a. The conductive wiring pattern 150a covers at least a part of the elastic resin pattern 120a and extends to the conductive pad 104. The conductive wiring pattern 150a and the elastic resin pattern 120a configure the compliant bump 110. The elastic resin pattern 120a may serve as a core of the compliant bump 110 and may relieve strain due to a height difference between neighboring bumps in a bump bonding process.

In the method described above in relation to FIGS. 3A to 3F, the plated layer 156a is formed between the operation of forming the seed layer 154 and the operation of forming the seed pattern 154a. In this case, the first region C1 where the blocking pattern 162 illustrated in FIG. 3B is formed may extend to a region between the conductive wiring patterns 150a illustrated in FIG. 4. The plated layer 156a serves as a hard mask in the subsequent etching process and thus needs to be deposited with an extra thickness. When the plated layer 156a isotropically grows on the seed layer 154, since the plated layer 156a can be unnecessarily formed outside the edge of the seed layer 154 to cause an electrical short, the blocking pattern 162 may be formed before the plated layer 156a is formed.

On the other hand, in the method described above in relation to FIGS. 5A to 5E, the plated layer 156a is formed after the operation of forming the seed layer 154 and the operation of forming the seed pattern 154a. In this case, the second region D1 where the blocking pattern 164 illustrated in FIG. 5B is formed may extend to a region between the conductive wiring patterns 150a illustrated in FIG. 4. The plated layer 156a does not serve as a hard mask in the subsequent etching process and thus does not need to be deposited with an extra thickness. When the plated layer 156a anisotropically grows on the seed layer 154, since the plated layer 156a is not unnecessarily formed outside the edge of the seed layer 154, the plated layer 156a may be formed after the seed pattern 154a is formed.

Figure 6A:
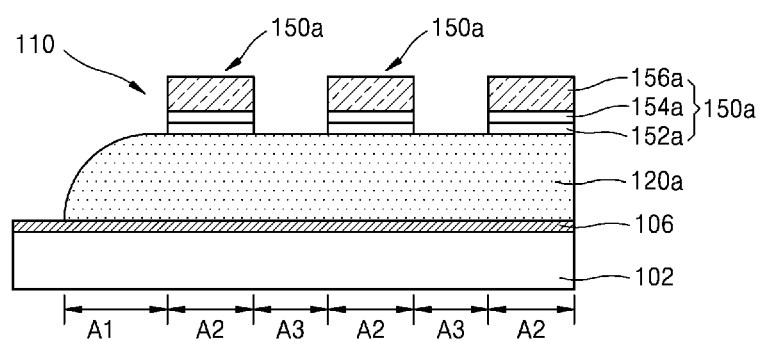
FIGS. 6A and 6B are cross-sectional and perspective views of a structure formed using a method of manufacturing compliant bumps, according to a first embodiment of the present invention.
Figure 6B:
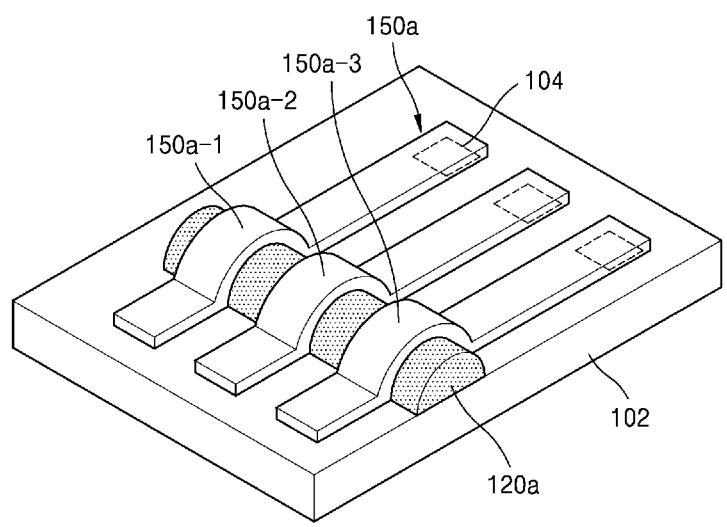

FIGS. 6A and 6B are cross-sectional and perspective views of a structure formed using a method of manufacturing compliant bumps, according to a first embodiment of the present invention. Referring to FIGS. 6A and 6B, the at least one conductive pad 104 includes a plurality of conductive pads spaced apart from each other, and the conductive wiring patterns 150a include a plurality of conductive wiring patterns 150a-1, 150a-2, and 150a-3 spaced apart from each other. A height of a region A2 of a first elastic resin pattern 120a where the conductive wiring patterns 150a are located is equal to a height of an interval region A3 thereof between the plurality of conductive wiring patterns 150a. The first elastic resin pattern 120a may integrally extend to correspond to the plurality of conductive pads 104.

Figure 7A:
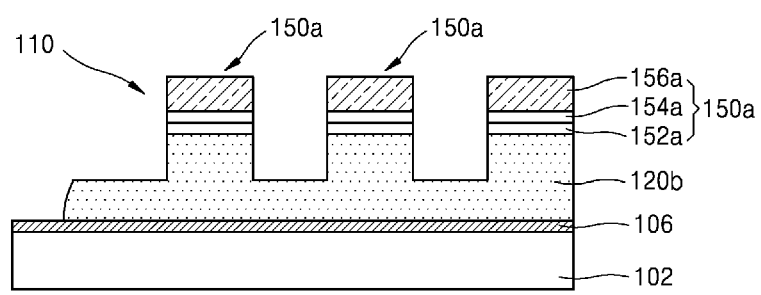
FIGS. 7A and 7B are cross-sectional and perspective views of a structure formed using a method of manufacturing compliant bumps, according to a second embodiment of the present invention.
Figure 7B:
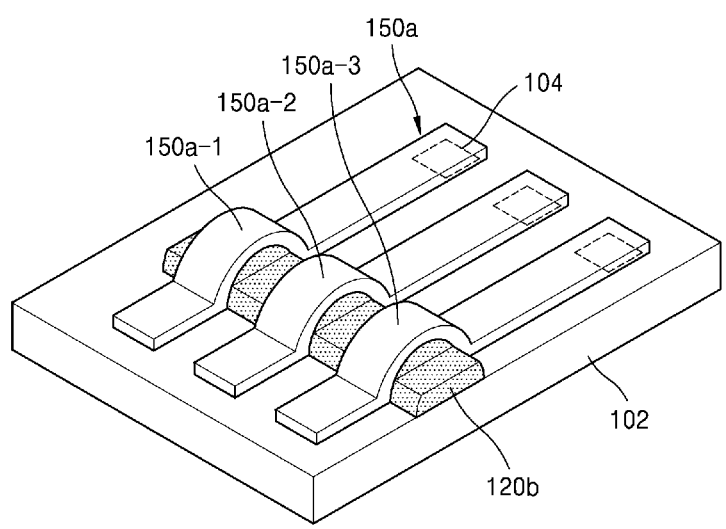

FIGS. 7A and 7B are cross-sectional and perspective views of a structure formed using a method of manufacturing compliant bumps, according to a second embodiment of the present invention. Referring to FIGS. 7A and 7B, a second elastic resin pattern 120b is formed by etching parts of the first elastic resin pattern 120a of the compliant bump structure illustrated in FIGS. 6A and 6B, which are exposed between the conductive wiring patterns 150a, by a partial thickness. The at least one conductive pad 104 includes a plurality of conductive pads spaced apart from each other, and the conductive wiring patterns 150a include a plurality of conductive wiring patterns 150a-1, 150a-2, and 150a-3 spaced apart from each other. A height of a region A2 of the second elastic resin pattern 120b where the conductive wiring patterns 150a are located is greater than a height of an interval region A3 thereof between the plurality of conductive wiring patterns 150a. The second elastic resin pattern 120b may integrally extend to correspond to the plurality of conductive pads 104.

Figure 8A:
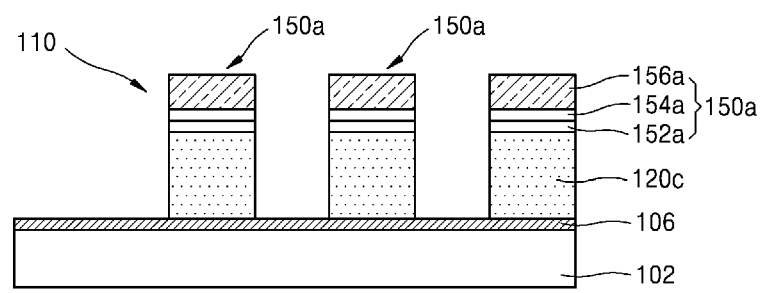
FIGS. 8A and 8B are cross-sectional and perspective views of a structure formed using a method of manufacturing compliant bumps, according to a third embodiment of the present invention.
Figure 8B:
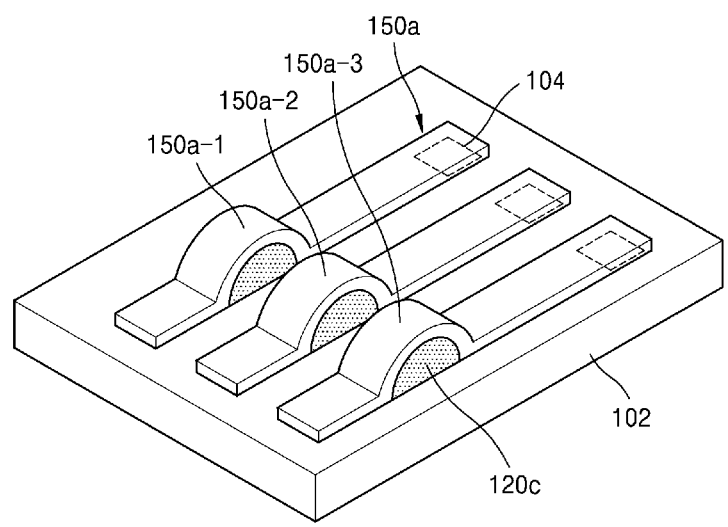

FIGS. 8A and 8B are cross-sectional and perspective views of a structure formed using a method of manufacturing compliant bumps, according to a third embodiment of the present invention. Referring to FIGS. 8A and 8B, a third elastic resin pattern 120c is formed by completely etching parts of the first elastic resin pattern 120a of the compliant bump structure illustrated in FIGS. 6A and 6B, which are exposed between the conductive wiring patterns 150a. In this case, the third elastic resin pattern 120c is not present between the conductive wiring patterns 150a and is present only under the conductive wiring patterns 150a. The at least one conductive pad 104 includes a plurality of conductive pads spaced apart from each other, and the conductive wiring patterns 150a include a plurality of conductive wiring patterns 150a-1, 150a-2, and 150a-3 spaced apart from each other. The third elastic resin pattern 120c includes a plurality of patterns spaced apart from each other to correspond to the plurality of conductive pads 104. In a structure formed using a method of manufacturing compliant bumps, according to a modified third embodiment of the present invention, the elastic resin patterns 120a illustrated in FIG. 2B may be previously formed and then the conductive wiring patterns 150a may be formed.

In the afore-described first to third embodiments, the conductive wiring pattern 150a covers at least a part of the elastic resin pattern 120a and extends to the conductive pad 104. The conductive wiring pattern 150a and the elastic resin pattern 120a configure the compliant bump 110. The elastic resin pattern 120a may serve as a core of the compliant bump 110 and may relieve strain due to a height difference between neighboring bumps in a bump bonding process. For example, when strain occurs in a bump bonding process due to a height difference between a first compliant bump having the elastic resin pattern as a core and including the first conductive wiring pattern 150a-1 and a second compliant bump having the elastic resin pattern as a core and including the second conductive wiring pattern 150a-2, the elastic resin pattern may relieve the occurred strain and stabilize the bonding process. One of the afore-described first to third embodiments may be appropriately selected according to an elastic strength of the elastic resin pattern, a bonding pitch, and a height difference between neighboring bumps.

While the present invention has been particularly shown and described with reference to embodiments thereof, it will be understood by one of ordinary skill in the art that various changes in form and details may be made therein without departing from the scope of the present invention as defined by the following claims.

The invention claimed is:

1. A method of manufacturing compliant bumps, the method comprising:
    preparing an electronic device comprising at least one conductive pad;
    forming an elastic resin layer on the electronic device;
    forming a photoresist layer on the elastic resin layer;
    forming a first photoresist pattern on a region spaced apart from a region where the conductive pad is located, by performing a photolithography process on the photoresist layer;
    forming a second photoresist pattern having a lower cross-sectional area greater than an upper cross-sectional area, by performing a bake process on the first photoresist pattern;
    forming an elastic resin pattern having a lower cross-sectional area greater than an upper cross-sectional area, on a region spaced apart from a region where the conductive pad is located, by performing an etching process on the elastic resin layer by using the second photoresist pattern as a mask; and
    forming a conductive wiring pattern covering at least a part of the elastic resin pattern and extending to the conductive pad.

2. The method of claim 1, wherein the forming of the conductive wiring pattern comprises:
    sequentially forming a barrier metal layer and a seed layer on the electronic device having the elastic resin pattern formed thereon and comprising the conductive pad;
    forming a blocking pattern selectively on a first region of the seed layer and forming a plated layer on the seed layer; and
    forming a seed pattern and a barrier metal pattern by removing the blocking pattern and then etching exposed parts of the seed layer and the barrier metal layer.

3. The method of claim 1, wherein the forming of the conductive wiring pattern comprises:
    sequentially forming a barrier metal layer and a seed layer on the electronic device having the elastic resin pattern formed thereon and comprising the conductive pad;
    forming a blocking pattern selectively on a second region of the seed layer, and forming a barrier metal pattern and a seed pattern on the electronic device by etching parts of the seed layer and the barrier metal layer; and
    forming a plating pattern on the seed pattern.

4. The method of claim 1, wherein the at least one conductive pad comprises a plurality of conductive pads spaced apart from each other,
    wherein the conductive wiring pattern comprises a plurality of conductive wiring patterns spaced apart from each other, and
    wherein the elastic resin pattern has a height of a region thereof where the conductive wiring patterns are located, which is equal to a height of an interval region thereof between the plurality of conductive wiring patterns, and integrally extends to correspond to the plurality of conductive pads.

5. The method of claim 1, wherein the at least one conductive pad comprises a plurality of conductive pads spaced apart from each other,
    wherein the conductive wiring pattern comprises a plurality of conductive wiring patterns spaced apart from each other, and wherein parts of the elastic resin pattern exposed between the plurality of conductive wiring patterns are etched by a partial thickness after the conductive wiring patterns are formed, such that the elastic resin pattern has a height of a region thereof where the conductive wiring patterns are located, which is greater than a height of an interval region thereof between the plurality of conductive wiring patterns, and integrally extends to correspond to the plurality of conductive pads.

6. The method of claim 1, wherein the at least one conductive pad comprises a plurality of conductive pads spaced apart from each other,
wherein the conductive wiring pattern comprises a plurality of conductive wiring patterns spaced apart from each other, and
wherein parts of the elastic resin pattern exposed between the plurality of conductive wiring patterns are completely etched after the conductive wiring patterns are formed, such that the elastic resin pattern comprises a plurality of elastic resin patterns formed only under the conductive wiring patterns and spaced apart from each other to correspond to the plurality of conductive pads.

7. The method of claim 1 wherein the at least one conductive pad comprises a plurality of conductive pads spaced apart from each other,
wherein the conductive wiring pattern comprises a plurality of conductive wiring patterns spaced apart from each other, and
wherein the first photoresist pattern comprises a pattern integrally extending to correspond to the plurality of conductive pads.

8. The method of claim 1, wherein the at least one conductive pad comprises a plurality of conductive pads spaced apart from each other,
wherein the conductive wiring pattern comprises a plurality of conductive wiring patterns spaced apart from each other, and
wherein the first photoresist pattern comprises a plurality of patterns spaced apart from each other to correspond to the plurality of conductive pads.

9. The method of claim 2, wherein the at least one conductive pad comprises a plurality of conductive pads spaced apart from each other,
wherein the conductive wiring pattern comprises a plurality of conductive wiring patterns spaced apart from each other, and
wherein the elastic resin pattern has a height of a region thereof where the conductive wiring patterns are located, which is equal to a height of an interval region thereof between the plurality of conductive wiring patterns, and integrally extends to correspond to the plurality of conductive pads.

10. The method of claim 3, wherein the at least one conductive pad comprises a plurality of conductive pads spaced apart from each other,
wherein the conductive wiring pattern comprises a plurality of conductive wiring patterns spaced apart from each other, and
wherein the elastic resin pattern has a height of a region thereof where the conductive wiring patterns are located, which is equal to a height of an interval region thereof between the plurality of conductive wiring patterns, and integrally extends to correspond to the plurality of conductive pads.

11. The method of claim 2, wherein the at least one conductive pad comprises a plurality of conductive pads spaced apart from each other,
wherein the conductive wiring pattern comprises a plurality of conductive wiring patterns spaced apart from each other, and
wherein parts of the elastic resin pattern exposed between the plurality of conductive wiring patterns are etched by a partial thickness after the conductive wiring patterns are formed, such that the elastic resin pattern has a height of a region thereof where the conductive wiring patterns are located, which is greater than a height of an interval region thereof between the plurality of conductive wiring patterns, and integrally extends to correspond to the plurality of conductive pads.

12. The method of claim 3, wherein the at least one conductive pad comprises a plurality of conductive pads spaced apart from each other, wherein the conductive wiring pattern comprises a plurality of conductive wiring patterns spaced apart from each other, and wherein parts of the elastic resin pattern exposed between the plurality of conductive wiring patterns are etched by a partial thickness after the conductive wiring patterns are formed, such that the elastic resin pattern has a height of a region thereof where the conductive wiring patterns are located, which is greater than a height of an interval region thereof between the plurality of conductive wiring patterns, and integrally extends to correspond to the plurality of conductive pads.

13. The method of claim 2, wherein the at least one conductive pad comprises a plurality of conductive pads spaced apart from each other,
wherein the conductive wiring pattern comprises a plurality of conductive wiring patterns spaced apart from each other, and
wherein parts of the elastic resin pattern exposed between the plurality of conductive wiring patterns are completely etched after the conductive wiring patterns are formed, such that the elastic resin pattern comprises a plurality of elastic resin patterns formed only under the conductive wiring patterns and spaced apart from each other to correspond to the plurality of conductive pads.

14. The method of claim 3, wherein the at least one conductive pad comprises a plurality of conductive pads spaced apart from each other,
wherein the conductive wiring pattern comprises a plurality of conductive wiring patterns spaced apart from each other, and
wherein parts of the elastic resin pattern exposed between the plurality of conductive wiring patterns are completely etched after the conductive wiring patterns are formed, such that the elastic resin pattern comprises a plurality of elastic resin patterns formed only under the conductive wiring patterns and spaced apart from each other to correspond to the plurality of conductive pads.

* * * * *